United States Patent
Day et al.

(10) Patent No.: US 6,178,534 B1
(45) Date of Patent: Jan. 23, 2001

(54) SYSTEM AND METHOD FOR USING LBIST TO FIND CRITICAL PATHS IN FUNCTIONAL LOGIC

(75) Inventors: Leland Leslie Day; Paul Allen Ganfield, both of Rochester, MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/076,221

(22) Filed: May 11, 1998

(51) Int. Cl.[7] .................................................. G01R 31/28
(52) U.S. Cl. ........................ 714/745; 714/724; 714/726
(58) Field of Search .................................. 714/745, 724, 714/726, 727, 729, 731, 733, 739, 744

(56) References Cited

U.S. PATENT DOCUMENTS

| | | | |
|---|---|---|---|
| 4,340,857 | 7/1982 | Fasang | 324/73.1 |
| 4,377,757 | 3/1983 | Könemann et al. | 307/303 |
| 4,433,413 | 2/1984 | Fasang | 714/736 |
| 4,513,418 | 4/1985 | Bardell, Jr. et al. | 714/736 |
| 5,018,144 | 5/1991 | Corr et al. | 714/726 |
| 5,150,044 * | 9/1992 | Hashizume et al. | 324/158 R |
| 5,260,949 * | 11/1993 | Hashizume et al. | 714/726 |
| 5,416,919 * | 5/1995 | Ogino et al. | 714/724 |
| 5,515,382 * | 5/1996 | Lassorie | 714/726 |
| 5,592,493 * | 1/1997 | Crouch et al. | 714/726 |
| 5,612,963 | 3/1997 | Koenemann et al. | 714/738 |
| 5,617,426 | 4/1997 | Koenemann et al. | 714/726 |
| 5,663,966 | 9/1997 | Day et al. | 714/726 |
| 5,790,561 * | 8/1998 | Borden et al. | 714/724 |

* cited by examiner

Primary Examiner—Hoa T. Nguyen
(74) Attorney, Agent, or Firm—Mark A. Hollingsworth

(57) ABSTRACT

A system and method for conducting a repeatable logic test on at least one functional unit of an IC chip includes steps of selecting at least one functional unit of at least several functional units, propagating test data through a part or all functional units of the time domain; and capturing test data of the selected functional unit. The functional units are either selected or held inactive such that only the selected functional unit is allowed to capture the test results for determining a critical timing path within the selected functional unit and only the functional unit. By selecting different combination of the functional unit(s), a number of the critical timing paths are readily determined in the chip.

29 Claims, 10 Drawing Sheets

| SCAN | HOLD | F0 (Data) | F1 (Scan/Hold) | CONTROL STATUS |
|------|------|-----------|----------------|----------------|
| 0 | 0 | 1 | 0 | Data |
| 0 | 1 | 0 | 0 | Hold |
| 1 | 0 | 0 | 1 | Scan |
| 1 | 1 | 0 | 0 | Hold |

FIGURE 5

SYSTEM AND METHOD FOR USING LBIST TO FIND CRITICAL PATHS IN FUNCTIONAL LOGIC

FIELD OF THE INVENTION

The present invention relates generally to a system and method for testing an Integrated Circuit (IC) chip. More particularly, the present invention relates to a system and method for using a Logic Built-In Self-Test (LBIST) to test an IC chip and find critical paths in functional logic of the chip.

BACKGROUND OF THE INVENTION

In designing large scale integration (LSI) circuits or very large scale integration (VLSI) circuits, one important step is to incorporate testing circuits for the designs. The principle is to proceed testing methods concurrently with the architectural considerations of the designs as opposed to be left until fabricated chip or components of the chip have been made. This manufacturing test principle has been well recognized by the LSI and VLSI design industry.

The testing of large scale integration (LSI) packages, very large scale integration (VLSI) packages, and application-specific integrated circuits (ASIC) has become increasingly important as these components and circuits continue to increase in gate densities. With every successive generation having a greater number of gates to test, identifying critical paths in an IC chip becomes more and more important. A critical path (or called critical timing path) is a logical path that runs slower than predicted or slower than any other logical paths in the system. Typically it is very complicated to actually figure out a number of critical timing paths, for example the top ten critical timing paths on a silicon chip. There are timing tools that are used to predict a given set of logical paths. However, when the chip is tested in hardware, typically the logical paths predicted by timing tools can change. Accordingly, it is often desirable to have as many tools as possible to ease the finding of critical paths when there is hardware in hand.

A collection of test techniques have evolved over the history of the IC chip designs. One test technique is the Scan-based test technique which includes a popular approach called Level Sensitive Scan Design or the LSSD approach. Certain desired logic test patterns are serially inputted and shifted to the appropriate latch locations when the functional logic unit is operated in a "shift mode" (i.e., by withholding system clock excitations and turning on shift scan control signals to the functional logic unit). When this is done, the latch states will provide the desired stimuli for the testing of the related logic nets. Next, the test patterns are propagated through the nets by executing one or more steps of the "function mode" operation (i.e., by exercising one or more system clock excitations). The response patterns of the logic networks to the applied stimuli is captured by the system latches, in a known manner depending on certain details of hardware design, often replacing the original inputted test patterns. Then, the system reverts to the shift-mode operation, outputting the response patterns for examination and comparison with expected patterns which should be present if the circuitry has operated properly. The scan-based test is typically employed to test the component chips of the package as well as the package. The technique logically partitions the dense scan logic into portions which are bounded on the inputs and outputs by Shift Register Latches (SRLs) and package pins wherever system logic dictates. Tests are then generated individually for each partition. Other approaches of the scan-based test techniques have also been developed, such as serial scan, partial serial scan, parallel scan techniques, etc.

Another collection of test techniques evolved over the history of the chip designs is built-in self-test techniques. As the names have suggested, built-in self-test techniques rely on augmenting circuits to allow them to perform operations on themselves that prove correct or incorrect operations. One method of incorporating a built-in self-test module is to use signature analysis or cyclic-redundancy checking. This involves the use of a pseudo-random sequence generator (PRSG) to generate the input signals for a section of combined circuitry and then using a signature analyzer to observe the output signals. Signature analysis can be merged with the scan technique to create a structure known as Built-In Logic Block Observation (BILBO). Other built-in self-test methods including memory self-test and iterative logic array test techniques, etc.

Generally, a built-in self-test apparatus is provided for testing the overall functional operation of an IC chip which has microprocessor, RAM, ROM, PROM, address latch, I/O, functional logic units, buses, and other electronic circuits in the system.

U.S. Pat. No. 5,663,966 issued to Day et al., issued date Sep. 2, 1997, assigned to the common assignee of the present invention, International Business Machines Corporation, describes the scan-based testing in details, which is incorporated by reference.

U.S. Pat. No. 5,018,144 issued to Corr et al., issued date May 21, 1991, assigned to the common assignee of the present invention, International Business Machines Corporation, describes a scan test system providing an inexpensive transition fault test by changing the sequence of application of A/C and B clocks. Corr et al. discloses that in each machine test cycle, the B clock is triggered first, and the A/C clock is triggered second. Since the periodicity of the clocks is not changed for a particular cycle, less sophisticated scan test equipment can provide both transition fault and stuck fault testing.

A built-in self-test system described in U.S. Pat. No. 4,377,757 issued to Konemann et al., issued date Mar. 22, 1983, describes logic modules for integrated digital circuits and means for incorporating the logic modules for test pattern generation and for parallel test data monitoring to individually test circuit portions or modules of complex circuits.

U.S. Pat. No. 5,612,963, issued to Koenemann, et al., assigned to the common assignee of the present invention, International Business Machines Corporation, describes a hybrid pattern self-testing of integrated circuits employed in an on-chip fashion to provide desired test signals to circuits on the chip by means of the weighted random pattern method.

One existing built-in self-test system is used to test a system having a multiplier portion of the FPU (Floating Point Unit). The multiplier portion of the FPU can be designed as a dual rail to increase the speed of the logic. During a test operation, a testing system is usually not able to recognize the dual rail to guarantee that both sides of the rail always complementary during the random pattern generation of the test data bits. Control latches have been added to select one rail, both rails, or no rails during the test. However, this defeats the speed bonus of the dual rail design. Accordingly, the multiplier is being skipped or removed during the testing operation. The skipping or removing or deselecting of the multiplier during a testing operation is in fact predefined based on the system's desire.

Another existing built-in self-test system is used to a system having potentially problematic logic, such as Array Built-In Self-Test (ABIST) logic. In this case, a similar skipping or removing or deselecting of the problematic logic during the test is currently used. Again, the skipping or removing or deselecting of the particular problematic area during a testing operation is predefined based on the system's desire.

Even with the above and other existing testing techniques, it is still very difficult and complicated to actually select/deselect any combination of functional units of system logic to figure out what a number of the top critical timing paths on a chip are. One of the main concerns is that even though the timing tools predict a given set of critical timing paths, when the chip is tested in hardware, these paths usually change. Therefore, there is a need for as many test tools as possible to ease the finding of a number of critical timing paths.

The present invention provides a system and method for finding a number of critical timing paths in a chip by running a Logic Built-In Self-Test (LBIST) on a given or selected functional piece of logic (or referred to functional unit) in a chip. The present invention provides a solution to the above and other problems and offers other advantages over the prior art.

SUMMARY OF THE INVENTION

The present invention relates generally to a system and method for testing a chip. More particularly, the present invention relates to a system and method for using a Logic Built-In Self-Test (LBIST) to test a chip and find critical paths in functional logic of a chip.

In accordance with a preferred embodiment of the present invention, a testing system, LBIST, is developed for an IC chip. The chip allows to run LBIST on a given functional piece of logic. In one embodiment, the chip allows to run LBIST on and only on one or selected functional logic units, such as FPU (Floating Point Unit), FX (Fixed Point Unit), etc., and with all other functional units being shut off. Accordingly, the testing system permits the isolation of critical paths within the FPU or FX and only the FPU or FX or both if both are selected. In a testing operation, a controller of the chip allows the selection of any combination of up to a number of different functional units including the FPU (Floating Point Unit), FX (Fixed Point Unit), IU (Instruction Unit), SCU (Storage Control Unit) core, SCU (Storage Control Unit) xcore, etc.

In one embodiment of the present invention, a method for conducting logic tests on at least one functional unit of an IC chip, comprises the steps of:
  (a) selecting at least one functional unit of at least three functional units on a single time domain;
  (b) propagating test data through at least a part of the functional units of the single time domain; and
  (c) capturing the test data.

Further in one embodiment of the present invention, capturing the test data is through the at least one selected functional unit.

Still in one embodiment of the present invention, the step (b) of propagating the test data is to propagate through all functional units.

Yet in one embodiment of the present invention, when the test data of the at least one selected functional unit are captured, the test data of unselected functional units are not captured.

Further in one embodiment of the present invention, a critical timing path is determined through the at least one selected functional unit.

In one embodiment of the present invention, a test system for conducting logic tests on the at least one functional unit of an IC chip, comprises:
  (a) at least three functional units each including a portion of chip design logic;
  (b) a functional unit selecting controller, the controller selecting/deselecting each of the at least three functional units, such that at least one of the functional units is selected, and test data of the selected functional unit is captured;
  (c) at least one scan latch chain, the at least one scan latch chain coupled to the functional units, the at least one scan latch chain propagating test data and selectively capturing the test data based on a control signal of the functional unit selecting controller; and
  (d) a clock, coupled to the at least one scan latch chain, generating clock signals to propagate the test data through the at least one scan latch chain.

In one embodiment of the present invention, a method for finding a critical timing path during testing of system logic, the method comprising the steps of:
  (a) generating serial patterns of test bits;
  (b) dividing the system logic into a plurality of functional units to be tested in at least one portion of a scan chain;
  (c) selecting at least one functional unit of the plurality of functional units;
  (d) propagating test data through at least a part of the plurality of the functional units;
  (e) capturing the test data;
  (f) determining the critical timing path through the selected functional unit; and
  (g) selecting at least one different functional unit and repeating steps (d)–(f), such that a number of critical timing paths in the system logic are determined.

In another embodiment of the present invention, a functional unit can be tested in a portion of a scan chain or a combination of portions of scan chains. In further one embodiment, different portions of a scan chain can be used to test different functional units.

In one embodiment of the present invention, a method for conducting a repeatable logic test on at least three functional units of a chip, comprises the steps of:
  (a) selecting one of the functional units;
  (b) propagating test data through at least one of the functional units;
  (c) capturing the test data through the selected one functional unit; and
  (d) selecting a different one of the functional units and repeating steps (b)–(c) with the same test data.

In one embodiment of the present invention, a test system for conducting a repeatable logic test on at least three functional units of a chip, comprises:
  (a) a functional unit selecting controller, the controller selecting/deselecting each of the at least three functional units, such that at least one of the functional units is selected, and test data of the selected functional unit is captured;
  (b) at least one scan latch chain, the at least one scan latch chain coupled to the functional units, the at least one scan latch chain propagating the test data and selectively capturing the test data based on a control signal of the functional unit selecting controller;
  (c) a clock, coupled to the at least one scan latch chain, generating clock signals to propagate the test data through the at least scan latch chain; and (d) a pattern generator, coupled to the at least one scan latch chain, for generating a same set of test data for testing different one of the functional units.

These and other features and advantages of the present invention will become readily apparent to those skilled in the art from the following detailed description and corresponding drawings. As will be realized, the invention is capable of modification without departing from the invention. Accordingly, the drawing and description are to be regarded as illustrative in nature, and not as restrictive.

BRIEF DESCRIPTION OF THE DRAWINGS

Referring now to the drawings in which like reference numbers represent corresponding parts throughout:

FIG. 5 is a truth table for scan/hold signal control in the GSD latch as implemented in one embodiment of the present invention.

DETAILED DESCRIPTION OF THE PREFERRED EMBODIMENTS

High Level Description of the Preferred Embodiment of the Present Invention

Figure 1:
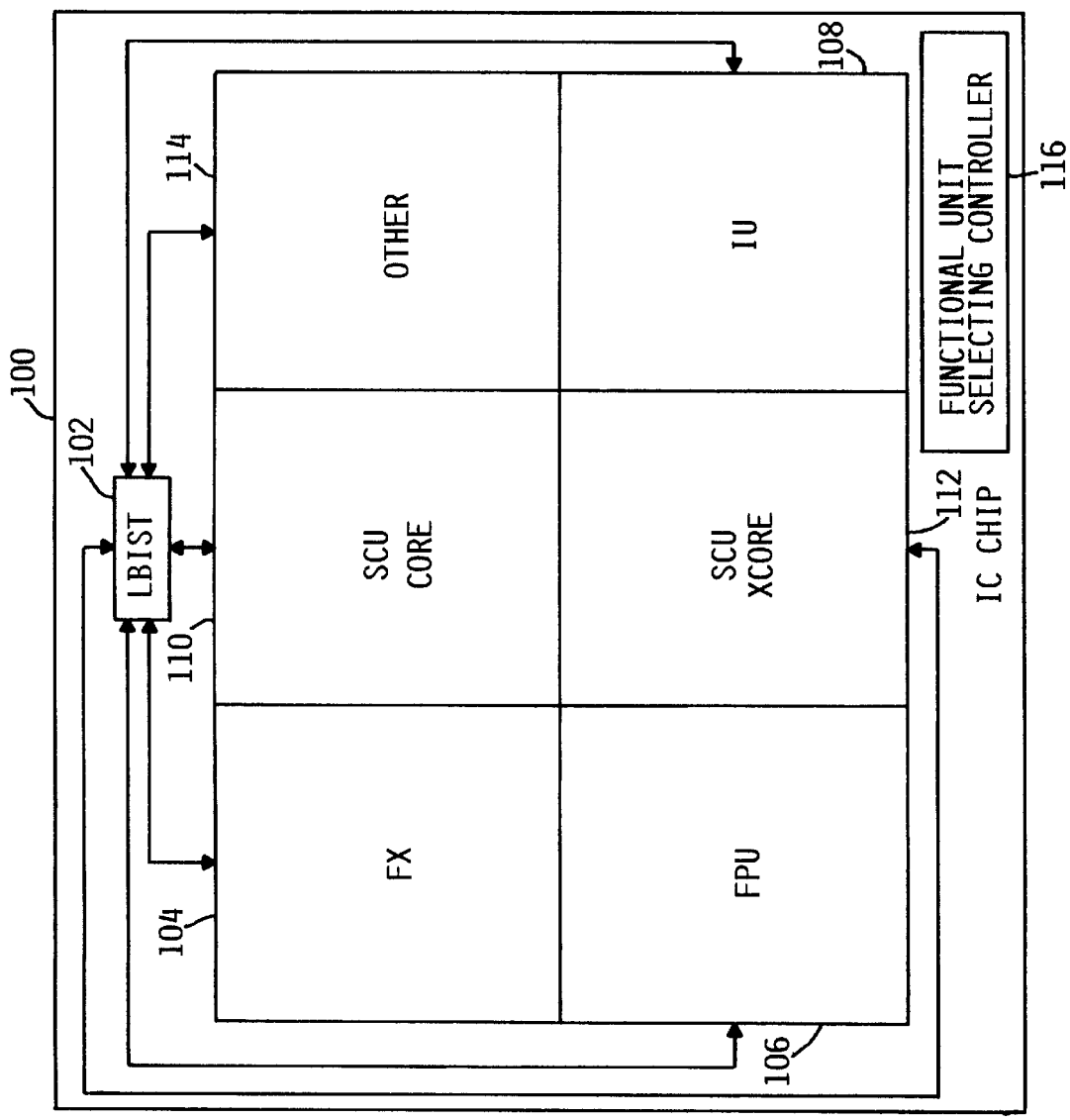
FIG. 1 is a diagram of an IC chip having a number of functional logic units and a Logic Built-In Self-Test (LBIST) system as implemented in one embodiment of the present invention.

With reference now to the figures and in particular with reference to FIG. 1, there is depicted a diagram of an IC chip 100 having a number of functional logic units and a Logic Built-In Self-Test (LBIST) 102 which may be utilized to implement the method and system of the present invention. It should be understood that FIG. 1 is intended to depict representative sample functional logic units or components of a chip at a high level, and that the number and types of such functional units or components may vary without departing the scope and spirit of the present invention. The primary hardware components and interconnections of the functional logic units of the chip may be arranged and configured in a manner known to integrated circuit (IC) design industry. The chip may include various registers, buffers, memories, and other sections which are all preferably formed by integrated circuitry. It should be understood that in the figures, the various hardware connections or data or control paths have been simplified. In addition, various components not germane to the invention described herein have been omitted, but it is to be understood that processors contain additional units for additional functions.

In FIG. 1, each functional unit may include a plurality of logic units which are grouped together for a particular functional purpose. For example, as shown in one embodiment, the functional units include FX (Fixed Point Unit) 104, FPU (Floating Point Unit) 106, IU (Instruction Unit) 108, SCU (Storage Control Unit) core 110, SCU (Storage Control Unit) xcore 112, and others 114. The x of SCU xcore generally refers to a specific storage control unit. The chip 100 may include several SCUs (Storage Control Units). The other functional units may also be test logic units for testing purposes, debug logic units for debugging purposes, etc.

Further in FIG. 1, a functional unit selecting controller 116 selects/deselects each of the functional units. In one embodiment, the Logic Built-In Self-Test (LBIST) 102 propagates scan data (test data) through all or a part of the functional units and captures the test data of one selected functional unit. Meanwhile, the controller 116 deselects or shuts off the other functional units. It is appreciated that other arrangements or configurations can be made within the principles of the invention. For example, more than one functional unit may be selected for running the LBIST. The determination of how many functional units are to be selected may depend on the ease of finding critical timing paths in the functional units and the trade off of having additional controls of scan latches or scan chains, etc. In a preferred embodiment of the present invention, the controller 116 selects any combination of up to six different functional units as shown in FIG. 1. It is appreciated that more than six different functional units can be selected in alternative embodiments. By selecting one or several functional units and deselecting or shutting off the other ones, it allows the isolation of critical paths within the selected functional unit(s) and only the selected one(s). Based on the captured test data, the chip 100 determines a critical timing path in the selected functional unit(s). Accordingly, by selecting/deselecting different combination of the functional units in running the same LBIST test, a number of critical timing paths among the entire system logic designs across the chip, e.g. the top ten critical timing paths, can be identified easily.

Figure 2:
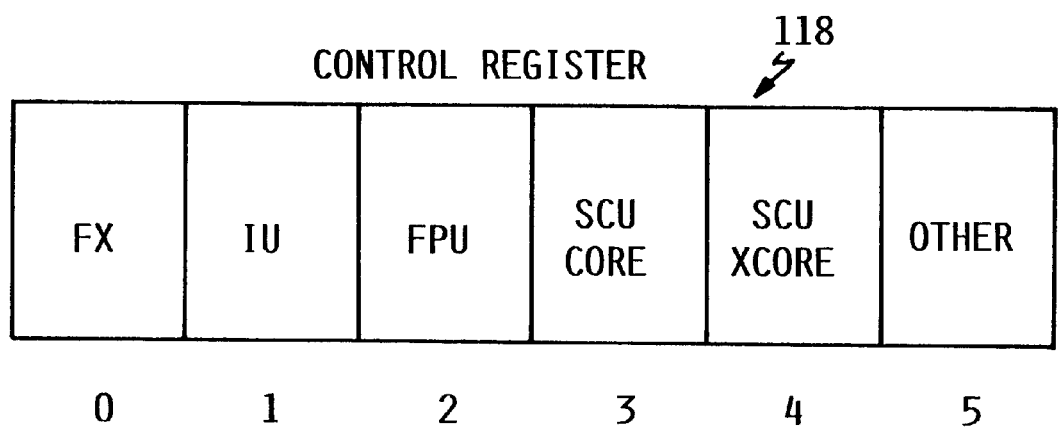
FIG. 2 is a diagram of a control register to select functional unit(s) as implemented in one embodiment of the present invention.

FIG. 2 illustrates a control register 118 in a high level block diagram. The control register 118 controls the various functional units to be selected and deselected in a LBIST test. In particular, the control register 118 controls hold/scan signals of the LBIST test operation such that the test is only performed on the latched or selected functional units, such as FPU. In the control register 118, the bits are logically related to the hold/scan signals of FIG. 3A (see details below) for a selected functional unit (FU), such that during a capture operation of the LBIST test, only the selected functional unit(s) is allowed to capture the test data. All other FUs have the "hold" line turned on which forces them to hold the data in the previous clock cycle and not to capture the test data.

Implementation of the Preferred Embodiment of the Present Invention

Figure 3A:
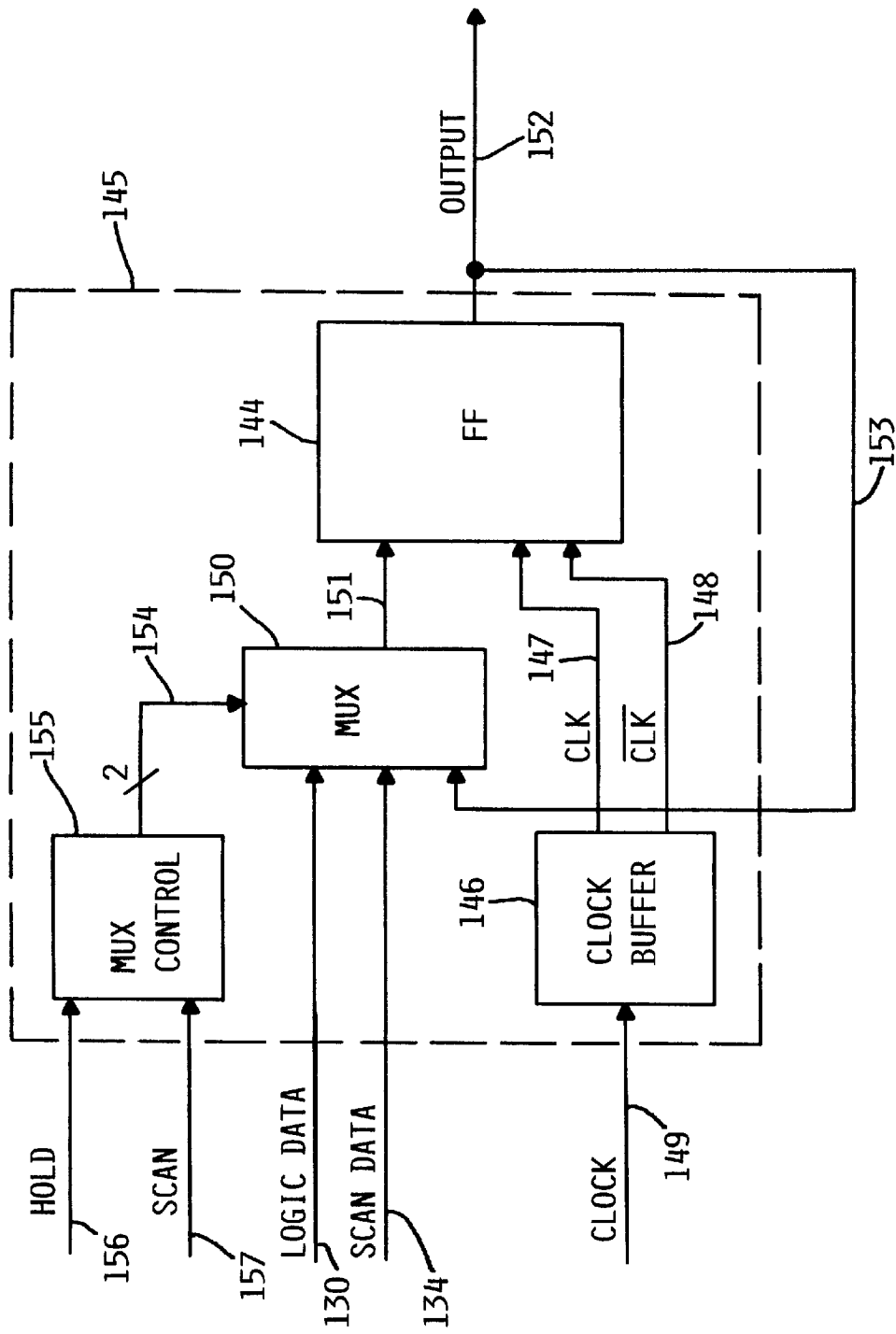
FIG. 3A is a block diagram of a Generalized Scan Design (GSD) latch as implemented in one embodiment of the present invention.
Figure 3B:
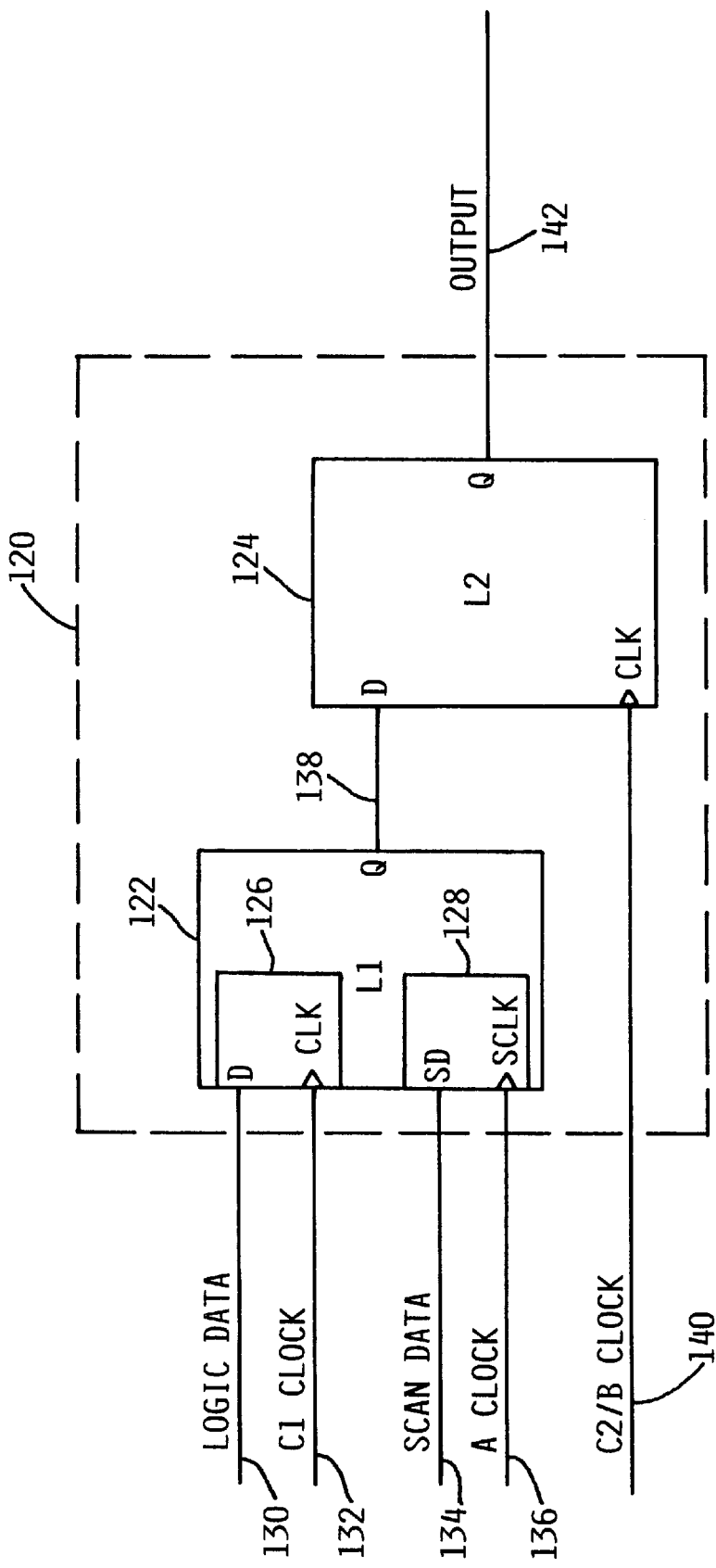
FIG. 3B is a block diagram of a LSSD (Level Sensitive Scan Design) latch using Shift Register Latches (SRL) as implemented in one embodiment of the present invention.

It is appreciated that there are many implementations that can be used without departure from the scope of the present invention. One preferred implementation is the GSD (Generalized Scan Design). A GSD latch is generally any type of scannable latch. A GSD latch 145 of FIG. 3A includes a scannable flip-flop 144 where the scan function is realized by controlling the data inputs. One embodiment of the GSD latch is shown in FIG. 3A which will be explained in details later. Another implementation is the LSSD (Level Sensitive Scan Design). In the LSSD (Level Sensitive Scan Design) methodology, a Shift Register Latch (SRL) receives a serial stream of data bits at its input and latches a data bit at its output upon receiving a clock signal. One embodiment of the LSSD latch is shown in FIG. 3B which will also be explained in details later. Various other implementation of the LBIST test can be used without departure from the principles of the present invention.

One basic mechanism is that a part or all functional units have data scanned into them for setup of the LBIST test. By using a control register shown in FIG. 2, hold/scan signals (as shown in FIG. 3A) are controlled such that only the latches corresponding to the selected functional unit(s) are allowed to capture the results of the LBIST test. The scanning, releasing, capturing functions and/or operations during the LBIST test will be explained below.

Referring to FIG. 3A, a Generalized Scan Design (GSD) latch 145 is used to propagate scan data bits. The scannable flip-flop, labeled FF 144 is a part of the Generalized Scan Design (GSD) latch 145. The scannable flip-flop FF 144 receives a clock signal and an inverted clock signal from the clock buffer 146 via lines 147 and 148, respectively. The clock buffer 146 buffers the clock input signal on line 149. The data to be latched by the FF 144 is received from a multiplexer labeled MUX 150 via line 151. The MUX 150 receives a logic data on line 130, a scan data on line 134, and an output data from the FF 144. The output data from the FF 144 is outputted on line 152 and fed back to the MUX 150 via a feedback line 153. The MUX 150 also receives control signals from a control bus 154. In one embodiment, the control bus 154 includes two bus lines. The control signals on the bus lines designate which of the input signals on lines 130, 134, and 153 are selected as the output to the MUX 150 on the line 151. A MUX control 155 provides the control signals on the control bus 154 according to inputs received at the MUX control 155, labeled a Hold signal on line 156 and a Scan signal on line 157. Depending on the two control signals from the MUX control 155, the MUX 150 selects one of the input signals on lines 130, 134, and 153. The control signals from the MUX control 155 can be "data" control signal which activates the logic data line 130 coupled to the MUX 150, or can be "scan" control signal which activates the scan data line 134 coupled to the MUX 150, or can be "hold" (or "feedback") control signal which activates the feedback line 153 coupled to the MUX 150.

FIG. 5 illustrates a truth table for scan/hold MUX control 155. One input of the MUX control 155 is a hold signal on the line 156, and the other input of the MUX control 155 is a scan signal on the line 157. F0 and F1 are the two output control signals of the MUX control 155. F0 represents a data line activation control signal, and F1 represents a hold/scan activation control signal. Generally, signal "0" means inactive, and signal "1" means active. It is appreciated that the definition of signal "0" and signal "1" can be the opposite without departure from the present invention. When the scan signal and the hold signal are both signal "0", i.e. both the scan and the hold are inactive, the data is active. In other words, F0 is "1", and F1 is, "0". The control status is "data", i.e. to activate the data line. Accordingly, when the output control signals F0, F1 which are 1,0 are in turn inputted to the MUX 150, the MUX 150 selects the logic data on the logic data line 130 to pass through and input into the FF 144 to be latched out to the output line 152 upon receiving a clock signal from the clock 149.

Further in FIG. 5, when the scan signal is signal "0" and the hold signal is signal "1", i.e. the scan is inactive, and the hold is active, the data is inactive. In other words, F0 is "0", and F1 is "0". The control status is "hold", i.e. to activate the hold or feedback line. Accordingly, when the output control signals F0, F1 which are 0,0 are in turn inputted to the MUX 150, the MUX 150 selects the hold or feedback data on the feedback line 153 to pass through and input into the FF 144 to be latched out to the output line 152 upon receiving a clock signal from the clock 149. In this case, the output on the line 152 is held unchanged from the previous clock cycle.

Still referring to FIG. 5, when the scan signal is signal "1", and the hold signal is signal "0", i.e. the scan is active, and the hold is inactive, the data is inactive. In other words, F0 is "0", and F1 is "1". The control status is "scan", i.e. to activate the scan line. Accordingly, when the output control signals F0, F1 which are 0,1 are in turn inputted to the MUX 150, the MUX 150 selects the scan data on the scan line 134 to pass through and input into the FF 144 to be latched out to the output line 152 upon receiving a clock signal from the clock 149.

Yet in FIG. 5, when the scan and the hold are both signal "1", i.e. both the scan and the hold are active, the data is inactive. In other words, F0 is "0", and F1 is "0". The control status is "hold", i.e. to activate the hold or feedback line. Accordingly, when the output control signals F0, F1 which are 0,0 are in turn inputted to the MUX 150, the MUX 150 selects the hold or feedback data on the feedback line 153 to pass through and input into the FF 144 to be latched out to the output line 152 upon receiving a clock signal from the clock 149. In this case, the output on the line 152 is held unchanged from the previous clock cycle.

Therefore, from the truth table as shown in FIG. 5, when F0,F1 are 1,0, the MUX 150 allows logic data on the logic data line 130 to pass and to be latched. When F0,F1 are 0,0, the MUX 150 forces the functional units to hold the status, i.e. to keep the same status as the previous clock cycle. Further, when F0,F1 are 0,1, the MUX 150 allows the scan data to pass and to be latched.

Figure 6:
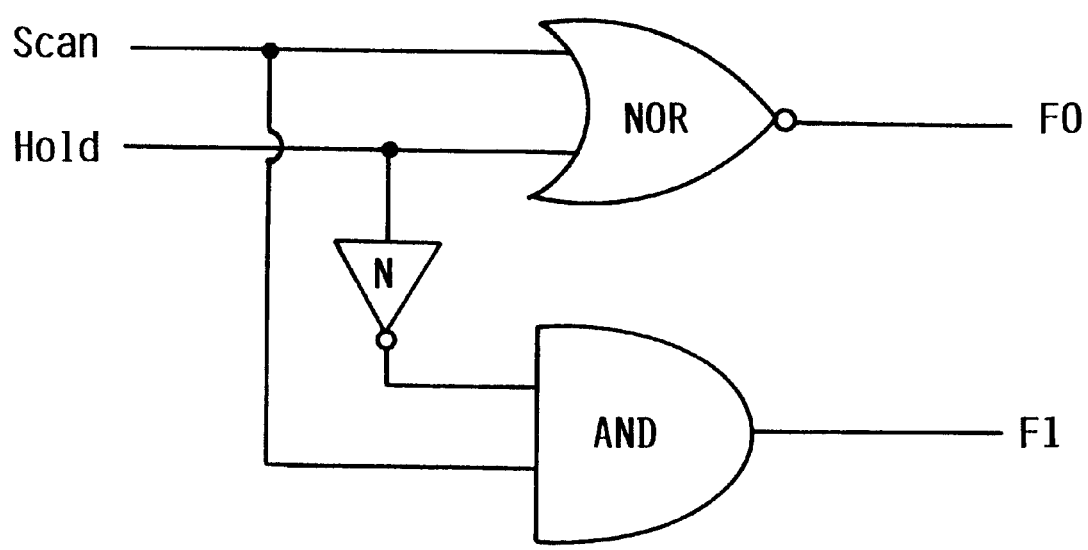
FIG. 6 is a logic diagram for the scan/hold signal control in the GSD latch as implemented in one embodiment of the present invention.

FIG. 6 is a logic diagram of the F0,F1 with respect to the scan/hold control in the GSD latch as shown in FIG. 5. F0 is logic NOR of the scan signal and the hold signal. F1 is logic AND of the scan signal and the inverted hold signal. It is appreciated that F0 can be logic OR or other equivalent logic of the scan signal and the hold signal depending on the definition of signal "0" and signal "1".

Figure 4A:
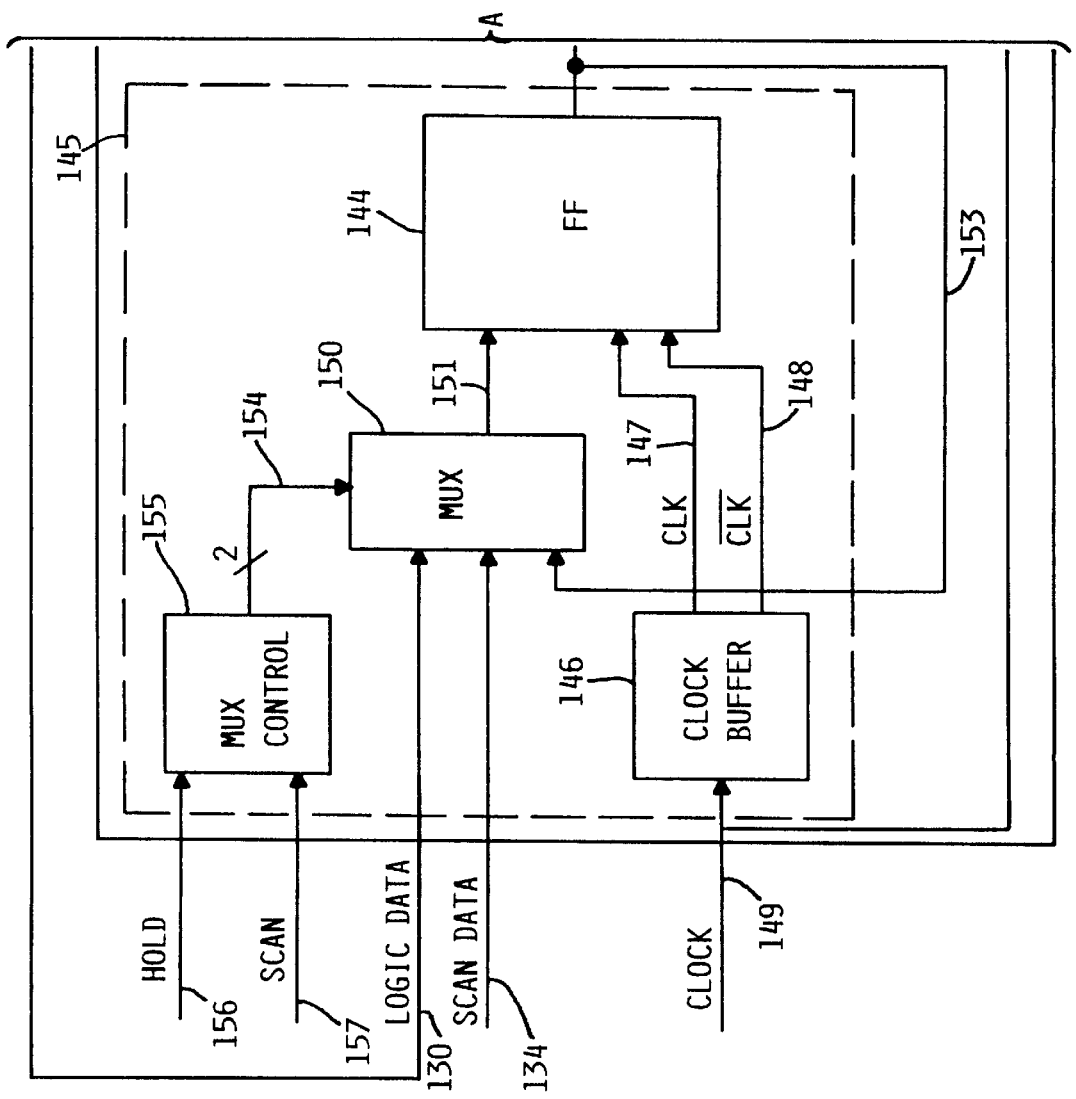
FIG. 4 is a block diagram illustrating release and capture functions associated with a scan chain (or referred to as scan ring or scan channel) coupled to functional units of a chip under test.
Figure 4B:
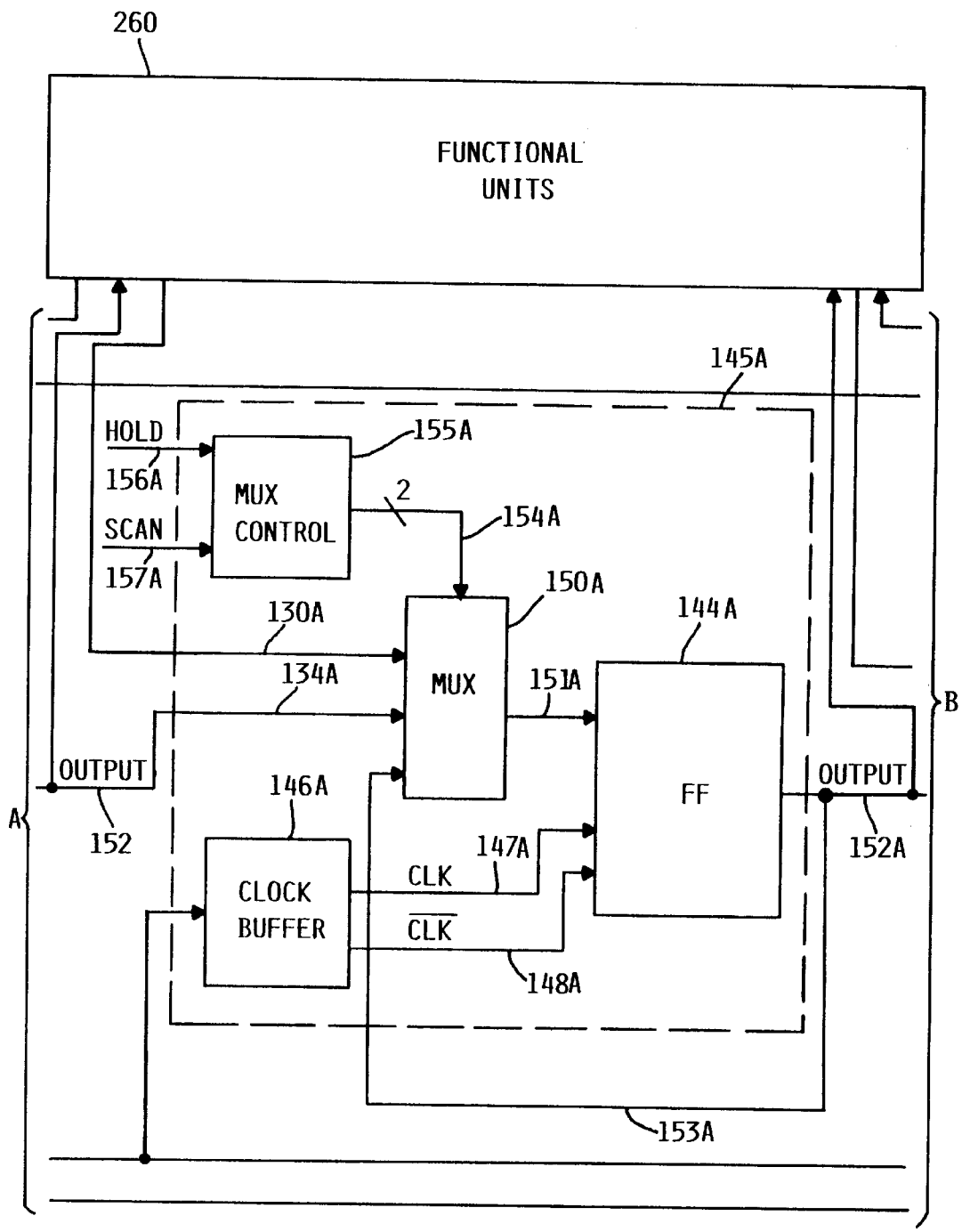
Figure 4C:
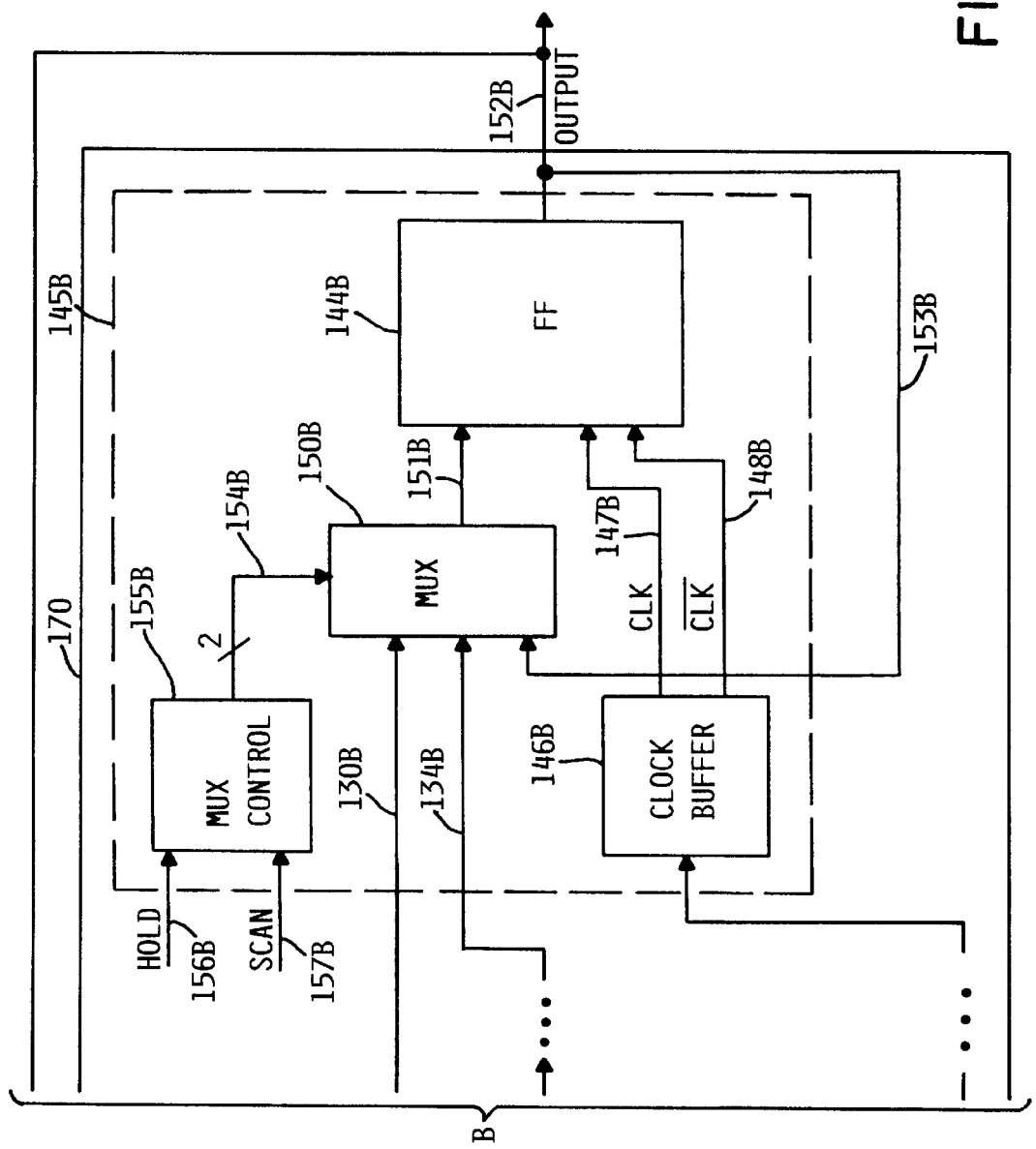

FIG. 4 is a diagram of a scan chain 170 having multiple latches coupled in series. The scan chain 170 includes GSD latches 145, 145A, through 145B coupled to functional units as mentioned above under test. FIG. 4 also illustrates the data scan, data release, and data capture functions associated with the scan chain. Scan chain is also referred to as scan ring or scan channel. The design functional units to be tested, labeled as 260, is shown connected to the scan chain 170. When a part or all of the scan data bits from scan line 134 have been stepped through scan chain 170, the scan data bits are ready to be "released" to the logic in the functional units 260. The scan data bits are released on output lines 152, 152A, through 152B of the GSDs 145, 145A, through 145B, respectively, which become inputs to the logic in the functional units 260. This release is effected on a pulse of the clock signal on line 149. In a preferred embodiment, all the scan data bits are released to the logic of all the functional units. It is appreciated that other embodiments can be used to release the scan data bits to the logic of a part of the functional units. The logic in the functional units 260 receive the scan data bits and act upon the scan data bits as though it were operating under normal circumstances, i.e. under normal logic data.

The outputs of the logic of the functional units 260 may then be returned to scan chain 170 to be "captured". To capture the logic test results, scan chain 170 receives the logic test results as logic data on lines 130, 130A, through 130B of the GSDs 145, 145A, through 145B, respectively. It is appreciated that a different scan chain could perform the capture function. Due to the capability of MUX control 155, the capture of the test data can be controlled. If the hold/scan signal of a corresponding latch is in the hold status, the outputs of the logic of the corresponding functional unit is not selected to be captured. The output line of the corresponding latch, e.g. 152, 152A, or 152B, remains the same as the feedback line 153, 153A, or 153B which is selected by the MUX 150. In other words, the corresponding functional unit is deselected in this clock cycle. Until the hold status from the MUX control 155, 155A, or 155B is changed to the data status or the scan status, the outputs of the logic in the corresponding functional unit are not captured.

The scan and hold signals in FIG. 4 are controlled on a given functional unit basis such that only the functional unit(s) of interest is allowed to clock new data into its(their) latch(es). Described in a higher level, the bits stored in the control register of FIG. 2 can be used to turn on/off the scan and hold signals. In one embodiment of the implementation, the scan and hold signals are values "0" or "1" illustrated in the truth table of FIG. 5. To select a functional unit to be tested, the scan and hold signals on the scan lines 157, 157A, or 157B and the hold lines 156, 156A, or 156B should be "0", "0", such that the test data on the logic data line 130, 130A, or 130B is captured and outputted to the FF 144. To deselect a functional unit such that the test data of this functional unit is not captured, the scan and hold signals on the scan lines 157, 157A, or 157B and the hold lines 156, 156A, or 156B should not be "0", "0". Since it is to hold the test data for the non-selected functional units, the hold signal should be "1".

Figure 7:
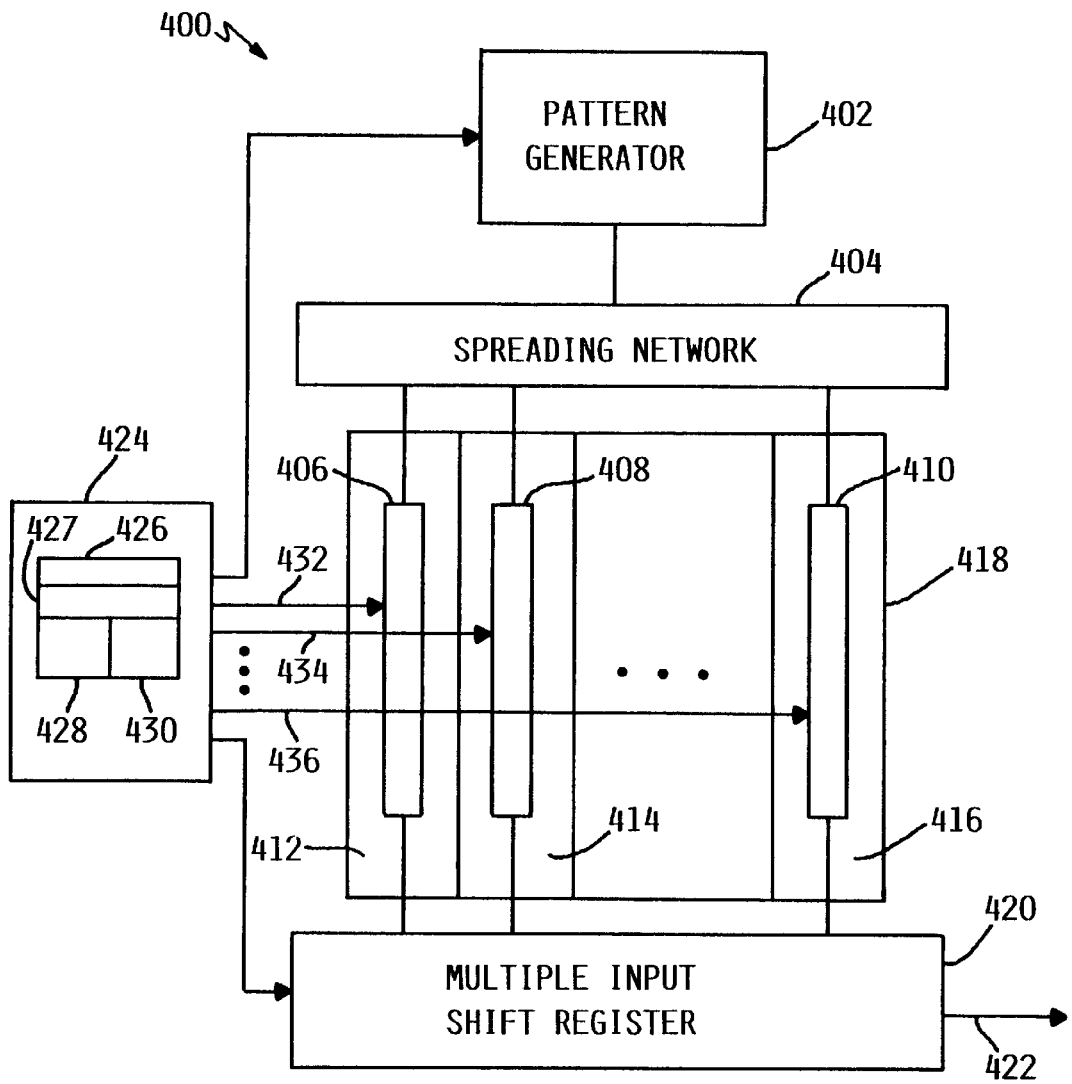
FIG. 7 is a block diagram of a STUMPS (Self-Test Using MISR (Multiple Input Shift Register) and Parallel SPSG (Shift Register Sequence Generator)) testing system implementing in one embodiment of the invention.

In FIG. 7, a STUMPS (Self-Test Using MISR (Multiple Input Shift Register) and Parallel SPSG (Shift Register Sequence Generator)) testing system 400 is illustrated in one embodiment of the present invention. A pattern generator 402 generates the scan data bits which are patterns of test bits. The pattern generator 402 of the preferred embodiment is a pseudo-random pattern generator (PRPG) which implements a n-bit linear feedback shift register (LFSR) counter which has $2^n-1$ states. Such LFSR counters are known in the art and are not described further herein. In one embodiment, the pattern generator 402 generates a same set of test data bits in a LBIST test. As a result, the LBIST test is repeatable which eases the finding of different levels of critical timing paths in the entire logic in the chip. In different tests, a different combination of functional unit(s) may be tested with a same set of test data bits so as to find its critical timing path(s). It is appreciated that in alternative embodiments, a different set of test data may be used for testing different functional units. Other pattern generators, including external testers, could also be utilized within the principles of the present invention.

The testing system 400 may include a spreading network 404. The pattern generator 402 is connected to the spreading network 404. Where there are multiple scan chains, the scan chains should not all be fed directly by the pseudo-random pattern generator (PRPG) of the preferred embodiment, so that the different scan chains receive different patterns of test bits. The spreading network 404 includes a number of exclusive-OR functions (not shown) that breaks up the patterns of test bits to be fed into the different scan chains.

The spreading network 404 then supplies all of the scan chains with the scan data bits. FIG. 7 includes scan chains 406, 408, through 410 in clusters of functional units 412, 414, through 416 of system logic 418, respectively. In a preferred embodiment, the scan chains are each coupled to a multiple input shift register (MISR) 420, which compresses the LBIST test results into signature which can be outputted via one binary value at a time on line 422. The signature can then be compared to an expected value of the test.

A control unit 424 may include a clock generator 426 and a scan/hold signal generator 427. The clock generator 426 generates a series of clock signals. Such clock generator 426 is known in the art and are not described further herein. The scan/hold signal generator 427 generates a series of control signals to select/deselect the functional units. The logic circuits for AND, NOR, or OR, etc. are known in the art and are not described further herein. The scan/hold signal generator 427 can also be implemented to use C1, A, C2/B clock signals as discussed above without departure from the scope of the present invention. The control unit 424 may also include a release sequencer 428 and a capture sequencer 430 which are used to release and capture the test data. Such release and capture sequencers are also known in the art and are not described further herein. The control unit 424 provides groups of scan/hold signals and clock signals to the scan chains 406, 408, through 410 on lines 432, 434, through 436, respectively. The scan and/or release functions are also referred to as propagation function which propagates test data to a part or all functional units. The control unit 424 can also be coupled to the PRPG 402 and the MISR 420 to control the times in which they are advanced by the clock signals.

It is appreciated that other implementations can be used within the scope of the present invention. For example, the LSSD (Level Sensitive Scan Design) as shown in FIG. 3B can be used to implement the present invention. The details of the LSSD Shift Register Latch (SRL) is described in U.S. Pat. No. 5,633,966 assigned to the common assignee, International Business Machines Corporation, which is incorporated by reference. FIG. 3B is similar to FIG. 3 of the patent. Therefore, the details on the implementation on the scan chain(s) of the LSSD is not repeated herein.

Further in FIG. 3B, to control the selection of the functional units 260 as discussed above in FIG. 4, instead of controlling the scan/hold signals as discussed above in FIG. 3A, the C1 clock, A clock, and C2/B clock on lines 132, 136, and 140 are controlled such that only the functional unit(s) of interest is allowed to capture data returned to line 130. Similar to FIG. 4 as discussed above, line 130 in FIG. 3B receives the return test data from the logic in the functional units 260. There are many ways of controlling the C1, A, C2/B clocks to turn on/off the functional units in accordance with the principles of the present invention as implemented in FIGS. 5 and 6. Generally, the bits in the control register of FIG. 2 can be used to turn on/off the clocks C1, A, C2/B. For example, to hold the test data, the C1 clock is inactivated (or often referred to no clock edge) or has a value of "0" or "1" depending on the definition. Meanwhile, A clock is also inactivated so that the output on line 142 remains the same. C2/B clock may also be inactivated.

In the preferred embodiment of the present invention, once the test data are captured, the test results can be scanned through the scan chain and displayed on a display, e.g. a computer display or monitor, etc. These test results are then compared with the expected results which it is assume that all the functional units and/or the latches are properly performed, so as to identify the mismatched test data. The logic paths which lead to the malfunctioned logic and/or latch can be then examined in a manner that is known in the art and are not described further herein.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A method for conducting logic tests on one or more functional units of a chip for determining one or more critical timing paths within the chip, the method comprising the steps of:
    selecting a particular one of the functional units of the chip for logic testing;
    deselecting from logic testing functional units other than the particular functional unit;
    propagating test data through at least a part of the particular functional unit;
    capturing the test data from the particular functional unit; and
    determining one or more critical timing paths within the particular functional unit using the captured test data.

2. The method of claim 1, wherein the selecting, deselecting, propagating, capturing, and determining steps are performed for particular ones of the functional units, wherein one or more critical timing paths are determined within the particular functional units using the respective captured test data.

3. The method of claim 2, wherein propagating the test data further comprises propagating the same test data through each of the particular functional units.

4. The method of claim 1, wherein the selecting, deselecting, propagating, capturing, and determining steps are performed for each of the functional units.

5. The method of claim 1, wherein propagating the test data further comprises propagating the same test data through each of the functional units.

6. An article of manufacture for a computer-based data processing system, the article of manufacture comprising a computer readable medium having instructions for causing a computer to perform a method comprising the steps of:
    selecting a particular one of a plurality of functional units of a chip for logic testing;
    deselecting from logic testing functional units other than the particular functional unit;
    propagating test data through at least a part of the particular functional unit;
    capturing the test data from the particular functional unit; and
    determining one or more critical timing paths within the particular functional unit using the captured test data.

7. The article of claim 6, wherein the selecting, deselecting, propagating, capturing, and determining steps are performed for particular ones of the functional units, wherein one or more critical timing paths are determined within the particular functional units using the respective captured test data.

8. The article of claim 7, wherein propagating the test data further comprises propagating the same test data through each of the particular functional units.

9. The article of claim 6, wherein the selecting, deselecting, propagating, capturing, and determining steps are performed for each of the functional units.

10. The article of claim 6, wherein propagating the test data further comprises propagating the same test data through each of the functional units.

11. A test system for conducting logic tests on at least one functional unit of a chip for determining one or more critical timing paths within the chip, comprising:
    a plurality of functional units each including a portion of chip design logic;
    a functional unit selecting controller, the controller selecting/deselecting each of the units, such that a particular one of the functional units is selected for logic testing and functional units other than the particular functional unit are deselected from logic testing;
    at least one scan latch chain, the at least one scan latch chain coupled to the functional units, the at least one scan latch chain propagating test data through the particular functional unit and selectively capturing the test data from the particular functional unit based on a control signal of the functional unit selecting controller, the test data captured by the scan latch chain being used by the test system to determine one or more critical timing paths within the particular functional unit; and
    a clock, coupled to the at least one scan latch chain, generating clock signals to propagate the test data through the at least one scan latch chain.

12. The test system of claim 11, wherein the at least one scan latch chain includes Generalized Scan Design latches.

13. The test system of claim 11, wherein the at least one scan latch chain includes Level Sensitive Scan Design (LSSD) latches.

14. The test system of claim 11, further comprising a pseudo-random pattern generator (PRPG), coupled to the at least one scan latch chain, for generating the test data for the at least one scan latch chain.

15. The test system of claim 11, further comprising a multiple input shift register (MISR), coupled to the at least one scan latch chain, for outputting the test data from the at least one scan latch chain.

16. A method for finding a critical timing path during testing of system logic, the method comprising the steps of:
    (a) generating test data using serial patterns of test bits;
    (b) dividing the system logic into a plurality of functional units to be tested;
    (c) selecting a first functional unit of the plurality of functional units and deselecting functional units other than the first functional unit;
    (d) propagating the test data through at least a portion of the first functional unit;
    (e) capturing the test data;
    (f) determining a critical timing path through the first functional unit using the captured test data; and
    (g) selecting a second functional unit different from the first functional unit and repeating steps (d)–(f) using the second functional unit, such that a number of critical timing paths in the system logic are determined.

17. The method of claim 16, wherein capturing the test data further comprises capturing the test data from the first functional unit.

18. The method of claim 16, wherein the step of propagating the test data further comprises propagating the same test data through all functional units selected for testing.

19. The method of claim 16, wherein only the test data of the selected functional units are captured, and the test data of deselected functional units are not captured.

20. A method for conducting a repeatable logic test on a plurality of functional units of a chip, comprising the steps of:

(a) selecting a particular one of the functional units and deselecting functional units other than the particular functional unit;

(b) propagating test data through the particular functional unit;

(c) capturing the test data through the particular functional unit and determining using the captured test data, one or more critical timing paths within the particular functional unit; and (d) selecting a functional unit other than the particular functional unit, deselecting the particular functional unit, and repeating steps (b)–(c).

21. The method of claim 20, wherein steps (b)–(c) are repeated with the same test data.

22. The method of claim 20, wherein steps (b)–(c) are repeated with a different test data.

23. A test system for conducting a repeatable logic test on a plurality of functional units of a chip, comprising:

a functional unit selecting controller, the controller selecting/deselecting each of the functional units, such that at least one of the functional units is selected for logic testing and functional units other than the selected functional unit are deselected from logic testing;

at least one scan latch chain, the at least one scan latch chain coupled to the functional units, the at least one scan latch chain propagating the test data through the selected functional unit and capturing the test data from the selected functional unit based on a control signal of the functional unit selecting controller, the test data captured by the scan latch chain being used by the test system to determine one or more critical timing paths within the selected functional unit;

a clock, coupled to the at least one scan latch chain, generating clock signals to propagate the test data through the at least scan latch chain; and a pattern generator, coupled to the at least one scan latch chain, for generating a set of test data for testing selected ones of the functional units.

24. The test system of claim 23, wherein the pattern generator generates a same set of test data for testing each of the selected functional units.

25. The test system of claim 23, wherein the pattern generator generates a different set of test data for testing each of the selected functional units.

26. The test system of claim 23, wherein the at least one scan latch chain includes Generalized Scan Design latches.

27. The test system of claim 23, wherein the at least one scan latch chain includes Level Sensitive Scan Design (LSSD) latches.

28. The test system of claim 23, wherein the pattern generator is a pseudo-random pattern generator (PRPG), coupled to the at least one scan latch chain, for generating the test data for the at least one scan latch chain.

29. The test system of claim 23, further comprising a multiple input shift register (MISR), coupled to the at least one scan latch chain, for outputting the test data from the at least one scan latch chain.

* * * * *